US009633620B2

(12) United States Patent
Cao

(10) Patent No.: US 9,633,620 B2
(45) Date of Patent: Apr. 25, 2017

(54) GOA CIRCUIT AND LIQUID CRYSTAL DISPLAY DEVICE

(71) Applicant: Shenzhen China Star Optoelectronics Technology Co., Ltd., Shenzhen, Guangdong (CN)

(72) Inventor: Shangcao Cao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 208 days.

(21) Appl. No.: 14/436,569

(22) PCT Filed: Jan. 12, 2015

(86) PCT No.: PCT/CN2015/070533
§ 371 (c)(1),
(2) Date: Apr. 17, 2015

(87) PCT Pub. No.: WO2016/106830
PCT Pub. Date: Jul. 7, 2016

(65) Prior Publication Data
US 2016/0343335 A1    Nov. 24, 2016

(30) Foreign Application Priority Data
Dec. 31, 2014    (CN) .......................... 2014 1 0856556

(51) Int. Cl.
*G09G 3/36*    (2006.01)
(52) U.S. Cl.
CPC ............. *G09G 3/3677* (2013.01); *G09G 3/36* (2013.01); *G09G 2310/0251* (2013.01); *G09G 2310/06* (2013.01); *G09G 2310/08* (2013.01)

(58) Field of Classification Search
CPC ............ G09G 2310/08; G09G 3/3685; G09G 3/3688; G09G 3/3692; G09G 2310/0286; G09G 2300/0482; G09G 2300/0842; G09G 2300/0847; G09G 2300/0852; G09G 2300/0857; G09G 2300/0861; G09G 2300/0866; G09G 3/3677; G09G 3/36; G09G 2310/0251; G09G 2310/06
See application file for complete search history.

(56) References Cited

U.S. PATENT DOCUMENTS

2011/0142192 A1*  6/2011  Lin ...................... G09G 3/3677
                                                              377/77
2015/0187312 A1*  7/2015  Dai ...................... G09G 3/3677
                                                             345/213

* cited by examiner

*Primary Examiner* — Lun-Yi Lao
*Assistant Examiner* — Jarurat Suteerawongsa
(74) *Attorney, Agent, or Firm* — Andrew C. Cheng

(57) ABSTRACT

The invention provides a GOA circuit and a liquid crystal display device each including multiple cascade connected GOA units. An nth-stage GOA unit is for charging an nth-stage horizontal scan line in a display area. The nth-stage GOA unit includes a pull-up control circuit, a pull-up circuit, a transfer circuit, a first pull-down control circuit, a first pull-down circuit, a second pull-down control circuit, a second pull-down circuit and a main pull-down circuit, where n is a positive integer. The invention can improve the stage-transfer efficiency of GOA circuit, improve the output quality of scan drive signal so as to increase charging ratio of LCD tubes and also can accelerate the pull-down speed of scan drive signal.

20 Claims, 3 Drawing Sheets

GOA CIRCUIT AND LIQUID CRYSTAL DISPLAY DEVICE

CROSS REFERENCE TO RELATED APPLICATION

This application claims the priority of Chinese Patent Application No. 201410856556.0, entitled "GOA Circuit and Liquid Crystal Display Device", filed on Dec. 31, 2014, the disclosure of which is incorporated herein by reference in its entirety.

BACKGROUND OF THE INVENTION

1. Field of the Invention

The present invention relates to the field of liquid crystal display technology, and in particular to a GOA circuit and a liquid crystal display device.

2. Description of Related Art

Liquid crystal display (LCD) devices have gradually replaced cathode ray tube (CRT) display devices and have been widely used in various electronic products due to their many advantages such as small-size and light-weight, energy saving, lower radiation level than the CRT display devices. Nowadays, the driving of horizontal scan lines of an active type LCD panel mainly is completed/performed by an externally connected IC of the panel, and the externally connected IC can control charging and discharging of the horizontal scanning lines stage by stage. A GOA (gate driver on array) technology uses a TFT (Thin Film Transistor) liquid crystal display array process to fabricate a circuit of line scan drive signal Gate on an array substrate, so as to achieve the progressive scanning drive of Gate, and therefore it can utilize the original/existing manufacturing process of liquid crystal display panel to form the drive circuit of horizontal scan lines around a display area on a substrate. The GOA technology can eliminate the bonding process step associated with the externally connected IC, improve productivity and reduce production costs, and make the LCD panels be more suitable for the narrow border or no border display products.

A main structure of the GOA circuit includes: a pull-up circuit, a pull-up control circuit, a transfer circuit, a pull-down circuit, a pull-down sustain circuit, and a boost (bootstrap) capacitor responsible for the potential boost-up. In the prior art, in the transfer circuit and the pull-up circuit of the GOA circuit, a CK (clock signal) mainly is used as an output source of a scan drive signal and a stage-transfer signal, but the CK, after passing through a COF (chip on film) and reaching to the GOA wire, the signal delay in itself is very serious, which not only affects the stage shift of GOA but also affects the output quality of scan drive signal at the expense of a certain charging ratio. A commonly used method for relieving the CK delay is widening the CK, but this will increase the border width of LCD device.

SUMMARY OF THE INVENTION

Embodiments of the invention provide a GOA circuit and a liquid crystal display (LCD) device, which can improve stage-transfer efficiency of GOA unit in the GOA circuit, improve output quality of scan drive signal to thereby increase the charging ratio of LCD tubes and also can accelerate pull-down speed of scan drive signal.

An embodiment of the invention provides a GOA circuit. The circuit includes a plurality of cascade connected GOA units. An nth-stage GOA unit of the plurality of cascade connected GOA units is configured (i.e., structured and arranged) for charging an nth horizontal scan line in a display area. The nth-stage GOA unit includes a pull-up control circuit, a pull-up circuit, a transfer circuit, a first pull-down control circuit, a first pull-down circuit, a second pull-down control circuit, a second pull-down circuit and a main pull-down circuit, where n is a positive integer.

the pull-up control circuit is configured for receiving an (n−2)th-stage stage-transfer signal outputted by an (n−2)th-stage GOA unit, and outputting a pull-up control signal according to the (n−2)th-stage stage-transfer signal;

the pull-up circuit is configured for receiving a DC high voltage signal and the pull-up control signal, and outputting a scan drive signal according to the DC high voltage signal and the pull-up control signal;

the transfer circuit is configured for receiving a clock signal and the pull-up control signal, and outputting an nth-stage stage-transfer signal according to the clock signal and the pull-up control signal;

the first pull-down control circuit is configured for receiving a first low-frequency signal and an (n+2)th-stage stage-transfer signal generated from an (n+2)th-stage GOA unit, and outputting a first pull-down control signal according to the first low-frequency signal and the (n+2)th-stage stage-transfer signal;

the first pull-down circuit is configured for receiving the first pull-down control signal and a DC low voltage signal, and pulling down the pull-up control signal according to the first pull-down control signal and the DC low voltage signal to thereby pull down the scan drive signal and the nth-stage stage-transfer signal;

the second pull-down control circuit is configured for receiving a second low-frequency signal and the (n+2)th-stage stage-transfer signal, and outputting a second pull-down control signal according to the second low-frequency signal and the (n+2)th-stage stage-transfer signal;

the second pull-down circuit is configured for receiving the second pull-down control signal and the DC low voltage signal, and pulling down the pull-up control signal according to the second pull-down control signal and the DC low voltage signal to thereby pull down the scan drive signal and the nth-stage stage-transfer signal;

the main pull-down circuit is configured for receiving the DC low voltage signal and the (n+2)th-stage stage-transfer signal, and pulling down the pull-up control signal and the scan drive signal according to the DC low voltage signal and the (n+2)th-stage stage-transfer signal.

In an embodiment, the first pull-down control circuit further is configured for receiving the DC high voltage signal and the second low-frequency signal, and outputting the first pull-down control signal according to the first low-frequency signal, the DC high voltage signal, the second low-frequency signal and the (n+2)th-stage stage-transfer signal.

In an embodiment, the second pull-down control circuit further is configured for receiving the DC high voltage signal and the first low-frequency signal, and outputting the second pull-down control signal according to the first low-frequency signal, the DC high voltage signal, the second low-frequency signal and the (n+2)th-stage stage-transfer signal.

In an embodiment, phases of the first low-frequency signal and the second low-frequency signal are reverse.

In an embodiment, the GOA circuit further includes: a pull-up holding circuit, configured for receiving the pull-up control signal and the DC low voltage signal, and pulling down the first pull-down control signal and the second pull-down control signal according to the pull-up control signal and the DC low voltage signal to thereby hold the pull-up circuit and the transfer circuit respectively to output the scan drive signal and the nth-stage stage-transfer signal.

In an embodiment, the pull-up control circuit is configured for receiving the DC high voltage signal, and outputting the pull-up control signal according to the (n−2)th-stage stage-transfer signal and the DC high voltage signal.

In an embodiment, the pull-up control circuit includes: a first thin film transistor, a control terminal thereof being configured for inputting with the (n−2)th-stage stage-transfer signal, a first terminal thereof being configured for inputting with the DC high voltage signal, a second terminal thereof being connected with a pull-up control signal node, and thereby the first thin film transistor being used for outputting the pull-up control signal according to the (n−2)th-stage stage-transfer signal and the DC high voltage signal.

In an embodiment, the pull-up control circuit includes: a second thin film transistor, a control terminal thereof being connected with the pull-up control signal node and used for receiving the pull-up control signal, a first terminal thereof being configured for inputting with the DC high voltage signal, a second terminal thereof being connected with a horizontal scan line, and thereby the second thin film transistor being used for outputting the scan drive signal according to the pull-up control signal and the DC high voltage signal.

In an embodiment, the transfer circuit includes: a third thin film transistor, a control terminal thereof being connected with the pull-up control signal node and used for receiving the pull-up control signal, a first terminal thereof being configured for inputting with the clock signal, and a second terminal thereof being configured for outputting the stage-transfer signal according to the pull-up control signal and the clock signal.

In an embodiment, the first pull-down control circuit includes: a fourth thin film transistor, a control terminal and a first terminal thereof being configured for inputting with the first low-frequency signal; a fifth thin film transistor, a control terminal thereof being connected with a second terminal of the fourth thin film transistor, and a first terminal thereof being configured for inputting with the first low-frequency signal; a sixth thin film transistor, a control terminal thereof being configured for inputting with the (n+2)th-stage stage-transfer signal, and a first terminal thereof being configured for inputting with the first low-frequency signal; second terminals of the fourth thin film transistor, the fifth thin film transistor and the sixth thin film transistor being connected with a first pull-down control signal node and used for outputting the first pull-down control signal.

In an embodiment, the first pull-down circuit includes: a seventh thin film transistor, a control terminal thereof being connected with the first pull-down control signal node and used for receiving the first pull-down control signal, a second terminal thereof being configured for inputting with a DC low voltage signal, a first terminal thereof being connected with the pull-up control signal node, and thereby the seventh thin film transistor being used for pulling down the pull-up control signal according to the first pull-down control signal and the DC low voltage signal; an eighth thin film transistor, a control terminal thereof being connected with the first pull-down control signal node and used for receiving the first pull-down control signal, a second terminal thereof being configured for inputting with the DC low voltage signal, a first terminal thereof being connected with the horizontal scan line, and thereby the eighth thin film transistor being used for pulling down the scan drive signal according to the first pull-down control signal and the DC low voltage signal.

In an embodiment, the second pull-down circuit includes: a ninth thin film transistor, a control terminal and a first terminal thereof being configured for inputting with the second low-frequency signal; a tenth thin film transistor, a control terminal thereof being connected with a second terminal of the ninth thin film transistor, and a first terminal being configured for inputting with the second low-frequency signal; an eleventh thin film transistor, a control terminal thereof being configured for inputting with the (n+2)th-stage stage-transfer signal, and a first terminal thereof being configured for inputting with the second low-frequency signal; second terminals of the ninth thin film transistor, the tenth thin film transistor and the eleventh thin film transistor being connected with a second pull-down control signal node and used for outputting a second pull-down control signal.

In an embodiment, the second pull-down circuit includes: a twelfth thin film transistor, a control terminal thereof being connected with the second pull-down control signal node and used for receiving the second pull-down control signal, a second terminal thereof inputting with the DC low voltage signal, a first terminal thereof being connected with the pull-up control signal node, and thereby the twelfth thin film transistor being used for pulling down the pull-up control signal according to the second pull-down control signal and the DC low voltage signal; a thirteen thin film transistor, a control terminal thereof being connected with the second pull-down control signal node and used for receiving the second pull-down control signal, a second terminal thereof being configured for inputting with the DC low voltage signal, a first terminal thereof being connected with the horizontal scan line, and thereby the thirteen thin film transistor being used for pulling down the scan drive signal according to the second pull-down control signal and the DC low voltage signal.

In an embodiment, the main pull-down circuit includes: a fourteenth thin film transistor, a control terminal thereof being configured for inputting with the (n+2)th-stage stage-transfer signal, a second terminal thereof being configured for inputting with the DC low voltage signal, a first terminal thereof being connected with the pull-up control signal node, and thereby the fourteenth thin film transistor being used for pulling down the pull-up control signal according to the (n+2)th-stage stage-transfer signal and the DC low voltage signal; a fifteenth thin film transistor, a control terminal thereof being configured for inputting with the (n+2)th-stage stage-transfer signal, a second terminal thereof being configured for inputting with the DC low voltage signal, a first terminal thereof being connected with the horizontal scan line, and thereby the fifteenth thin film transistor being used for pulling down the scan drive signal according to the (n+2)th-stage stage-transfer signal and the DC low voltage signal.

In an embodiment, the pull-up holding circuit includes: a sixteenth thin film transistor, a control terminal thereof being connected with the pull-up control signal node and used for receiving the pull-up control signal, a second terminal thereof being configured for inputting with the DC low voltage signal, a first terminal thereof being connected with the first pull-down control signal node, and thereby the sixteenth thin film transistor being used for pulling down the pull-down control signal according to the pull-up control signal and the DC low voltage; a seventeenth thin film transistor, a control terminal thereof being connected with the pull-up control signal node and used for receiving the pull-up control signal, a second terminal thereof being configured for inputting with the DC low voltage signal, a first terminal thereof being connected with the first pull-down control signal node, and thereby the seventeenth thin film transistor being used for pulling down the pull-down control signal according to the pull-up control signal and the DC low voltage signal; an eighteenth thin film transistor, a control terminal thereof being connected with the pull-up control signal node and used for receiving the pull-up control signal, a second terminal thereof being configured for inputting with the DC low voltage signal, a first terminal thereof being connected with the second pull-down control signal node, and thereby the eighteenth thin film transistor being used for pulling down the pull-down control signal according to the pull-up control signal and the DC low voltage signal; a nineteenth thin film transistor, a control terminal thereof being connected with the pull-up control signal node and used for receiving the pull-up control signal, a second terminal thereof being configured for inputting with the DC low voltage signal, a first terminal thereof being connected with the second pull-down control signal node, and thereby the nineteenth thin film transistor being used for pulling down the pull-down control signal according to the pull-up control signal and the DC low voltage signal; a twentieth thin film transistor, a control terminal thereof being connected with the pull-up control signal node and used for receiving the pull-up control signal, a second terminal thereof being connected with the second pull-down control signal node, a first terminal thereof being connected with the first pull-down control signal node, and thereby the twentieth thin film transistor being used for controlling the first pull-down control signal and the second pull-down control signal to be maintained at a same potential according to the pull-up control signal.

In an embodiment, the transfer circuit further includes: a bootstrap capacitor, the bootstrap capacitor being coupled with the control terminal and the second terminal of the third thin film transistor and used for boosting up the pull-up control signal.

In an embodiment, the first pull-down control circuit includes: a fourth thin film transistor, a control terminal and a first terminal being configured for inputting with the first low-frequency signal; a fifth thin film transistor, a control terminal thereof being connected with a second terminal of the fourth thin film transistor, and a first terminal thereof being configured for inputting with the first low-frequency signal; a sixth thin film transistor, a control terminal thereof being configured for inputting with the second low-frequency signal, and a first terminal thereof being configured for inputting with the first low-frequency signal; a twenty-first thin film transistor, a control terminal thereof being configured for inputting with the (n+2)th-stage stage-transfer signal, and a first terminal thereof being configured for inputting with the DC high voltage signal; second terminals of the fourth thin film transistor, the fifth thin film transistor, the twenty-first thin film transistor and the sixth thin film transistor being connected with the first pull-down control signal node and used for outputting the first pull-down control signal.

In an embodiment, the second pull-down control circuit includes: a ninth thin film transistor, a control terminal and a first terminal thereof being configured for inputting with the second low-frequency signal; a tenth thin film transistor, a control terminal thereof being connected with a second terminal of the ninth thin film transistor, and a first terminal being configured for inputting with the second low-frequency signal; an eleventh thin film transistor, a control terminal thereof being configured for inputting with the first low-frequency signal, and a first terminal thereof being configured for inputting with the second low-frequency signal; a twenty-second thin film transistor, a control terminal thereof being configured for inputting with the (n+2)th-stage stage-transfer signal, and a first terminal thereof being configured for inputting with the DC high voltage signal; second terminals of the ninth thin film transistor, the tenth thin film transistor, the twenty-second thin film transistor and the eleventh thin film transistor being connected with the second pull-down control signal node and used for outputting the second pull-down control signal.

In an embodiment, the pull-up control circuit includes: a first thin film transistor, a control terminal and a first terminal thereof being configured for inputting with the (n−2)th-stage stage-transfer signal, a second terminal thereof being connected with the pull-up control signal node, and thereby the first thin film transistor being used for outputting the pull-up control signal according to the (n−2)th-stage stage-transfer signal.

Correspondingly, the invention also provides a liquid crystal display (LCD) device which includes the above-described GOA circuit for liquid crystal displaying.

Sum up, the embodiments of the invention each use a DC high voltage signal as the input source of the pull-up circuit of GOA unit and only use a clock signal as the input source of the stage-transfer signal, which can avoid the impact on the stage-transfer efficiency caused by the delay of clock signal to thereby improve the stage-transfer efficiency of GOA unit, and also can improve the output quality of scan drive signal to thereby increase the charging ratio of LCD tubes.

BRIEF DESCRIPTION OF THE DRAWINGS

In order to more clearly illustrate the technical solution of embodiments of the invention, drawings will be used in the description of embodiments will be given a brief description below. Apparently, the drawings in the following description only are some of embodiments of the invention, the ordinary skill in the art can obtain other drawings according to these illustrated drawings without creative effort.

DETAILED DESCRIPTION OF THE PREFERRED EMBODIMENTS

In the following, with reference to accompanying drawings of embodiments of the invention, technical solutions in the embodiments of the invention will be clearly and completely described. Apparently, the embodiments of the invention described below only are a part of embodiments of the invention, but not all embodiments. Based on the described embodiments of the invention, all other embodiments obtained by ordinary skill in the art without creative effort belong to the scope of protection of the invention.

A GOA circuit and a liquid crystal display (LCD) device provided by embodiments of the invention will be described below in detail with reference to FIG. 1 through FIG. 6.

Figure 1:
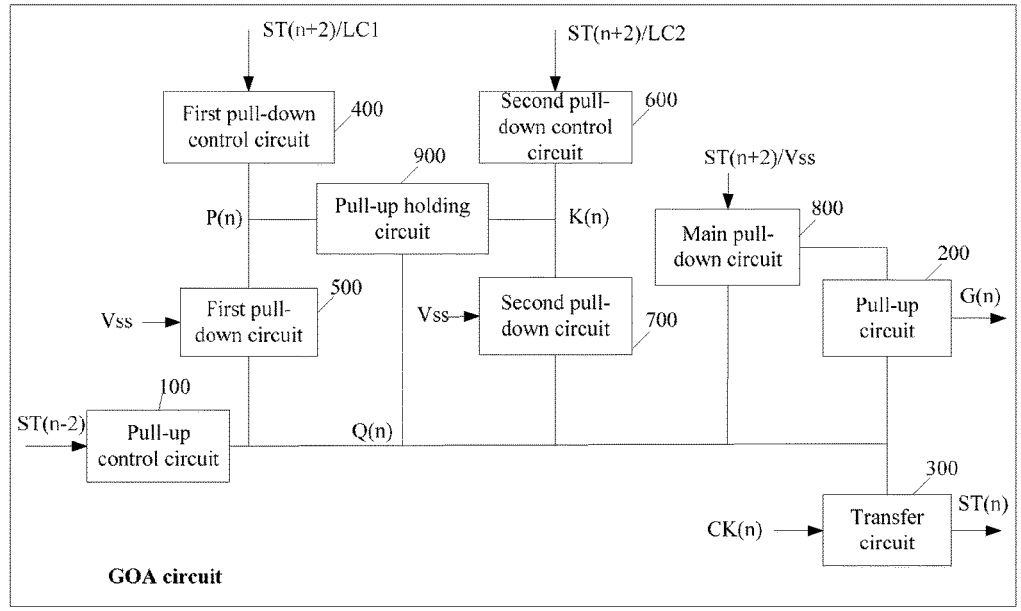
FIG. 1 is a structural schematic view of a GOA circuit provided by an embodiment of the invention.

Referring to FIG. 1, FIG. 1 is a structural schematic view of a GOA circuit provided by an embodiment of the invention. The GOA circuit as shown in the drawing at least includes: a pull-up control circuit 100, a pull-up circuit 200, a transfer circuit 300, a first pull-down control circuit 400, a first pull-down circuit 500, a second pull-down control circuit 600, a second pull-down circuit 700 and a main pull-down circuit 800.

The pull-up control circuit 100 receives an (n−2)th-stage stage-transfer signal ST(n−2) outputted by an (n−2)th-stage GOA (gate driver on array) unit and outputs a pull-up control signal Q(n) according to the (n−2)th-stage stage-transfer signal ST(n−2).

The pull-up circuit 200 is electrically connected with the pull-up control circuit 100, receives a direct current (DC) high voltage signal VDD and the pull-up control signal Q(n), and outputs a scan drive signal G(n) according to the DC high voltage signal VDD and the pull-up control signal Q(n).

The transfer circuit 300 is electrically connected with the pull-up control circuit 100 and the pull-up circuit 200, receives a clock signal CK(n) and the pull-up control signal Q(n), and outputs an nth-stage stage-transfer signal ST(n) according to the clock signal CK(n) and the pull-up control signal Q(n).

The first pull-down control circuit 400 receives a first low-frequency signal LC1 and an (n+2)th-stage stage-transfer signal ST(n+2) generated from an (n+2)th-stage GOA unit, and outputs a first pull-down control signal P(n) according to the first low-frequency signal LC1 and the (n+2)th-stage stage-transfer signal ST(n+2).

The first pull-down circuit 500 is electrically connected with the first pull-down control circuit 400, receives the first pull-down control signal P(n) and a DC low voltage signal Vss, and pulls down the pull-up control signal Q(n) according to the first pull-down control signal P(n) and the DC low voltage signal Vss to thereby pull down the scan drive signal G(n) and the nth-stage stage-transfer signal ST(n).

The second pull-down control circuit 600 receives a second low-frequency signal LC2 and the (n+2)th-stage stage-transfer signal ST(n+2), and outputs a second pull-down control signal K(n) according to the second low-frequency signal LC2 and the (n+2)th-stage stage-transfer signal ST(n+2).

The second pull-down circuit 700 is electrically connected with the pull-up control circuit 100, the pull-up circuit 200, the transfer circuit 300 and the second pull-down control circuit 600, receives the second pull-down control signal K(n) and the DC low voltage signal Vss, and pulls down the pull-up control signal Q(n) according to the second pull-down control signal K(n) and the DC low voltage signal Vss to thereby pull down the scan drive signal G(n) and the nth-stage stage-transfer signal ST(n).

The main pull-down circuit 800 is electrically connected with the pull-up control circuit 100, the pull-up circuit 200 and the transfer circuit 300, receives the DC low voltage signal Vss and the (n+2)th-stage stage-transfer signal ST(n+2), and pulls down the pull-up control signal Q(n) and the scan drive signal G(n) according to the DC low voltage signal Vss and the (n+2)th-stage stage-transfer signal ST(n+2).

In an alternative embodiment, the GOA circuit further includes: a pull-up holding circuit 900, being electrically connected with the pull-up control circuit 100, the first pull-down control circuit 400, the first pull-down circuit 500, the second pull-down control circuit 600 and the second pull-down circuit 700, receiving the pull-up control signal Q(n) and the DC low voltage signal Vss, and pulling down the first pull-down control signal P(n) and the second pull-down control signal K(n) according to the pull-up control signal Q(n) and the DC low voltage signal Vss to thereby hold the pull-up circuit 200 and the transfer circuit 300 respectively to output the scan drive signal G(n) and the nth-stage stage-transfer signal ST(n).

The embodiment of the invention uses the DC high voltage signal as the input source of the pull-up circuit of GOA unit and only uses the clock signal as the input source of the stage-transfer signal, which can avoid the impact on stage-transfer efficiency caused by the delay of clock signal, and therefore can improve the stage-transfer efficiency of GOA unit and improve the output quality of scan drive signal to thereby increase the charging ratio of LCD tubes.

Figure 2:
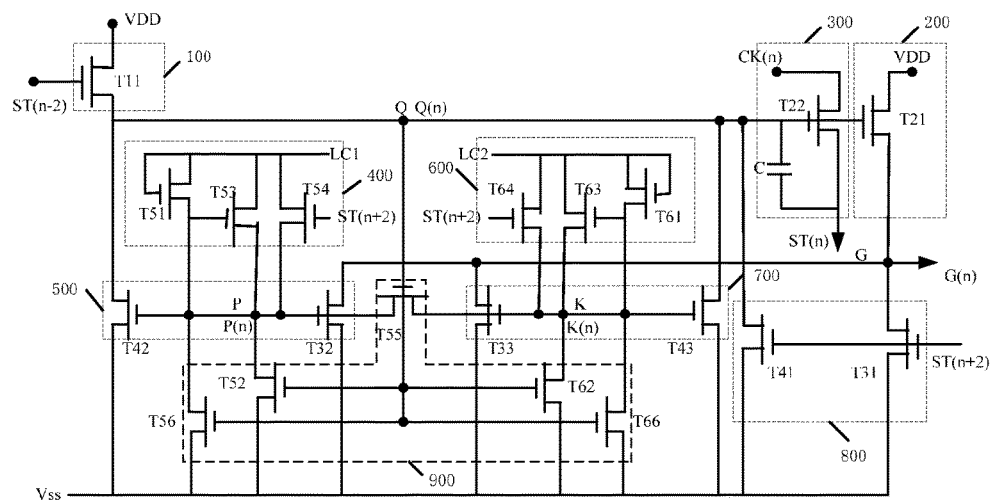
FIG. 2 is another structural schematic view of a GOA circuit provided by an embodiment of the invention.

Referring to FIG. 2, FIG. 2 is another structural schematic view of a GOA circuit provided by an embodiment of the invention. In conjunction with the structural schematic view of the GOA circuit shown in FIG. 1, the GOA circuit as shown in FIG. 2 includes: a pull-up control circuit 100, a pull-up circuit 200, a transfer circuit 300, a first pull-down control circuit 400, a first pull-down circuit 500, a second pull-down control circuit 600, a second pull-down circuit 700, a main pull-down circuit 800 and a pull-up holding circuit 900. In the illustrated embodiment, in order to facilitate illustration and description, and the connection relationships among the circuits and among electronic devices included in the circuits are shown in the related drawing, and thus will not be repeated in this specification.

The pull-up control circuit 100 concretely includes a first thin film transistor T11. A control terminal of the first thin film transistor T11 is inputted with the (n−2)th-stage stage-transfer signal ST(n−2), a first terminal thereof is inputted with the DC high voltage signal VDD, a second terminal thereof is connected with a pull-up control signal node Q, and thereby the first thin film transistor T11 is used to output the pull-up control signal Q(n) according to the (n−2)th-stage stage-transfer signal ST(n−2) and the DC high voltage signal VDD.

The pull-up circuit 200 concretely includes a second thin film transistor (T21). A control terminal of the second thin film transistor T21 is connected with the pull-up control signal node Q and used to receive the pull-up control signal Q(n), a first terminal thereof is inputted with the DC high voltage signal VDD, a second terminal is connected with a horizontal scan line G, and thereby the second thin film transistor T21 is used to output the scan drive signal G(n) according to the pull-up control signal Q(n) and the DC high voltage signal VDD.

The transfer circuit 300 specifically includes a third thin film transistor T22. A control terminal of the third thin film transistor T22 is connected with the pull-up control signal node Q and used to receive the pull-up control signal Q(n), a first terminal thereof is inputted with the clock signal CK(n), and a second terminal thereof outputs the stage-transfer signal ST(n) according to the clock signal CK(n) and the pull-up control signal Q(n).

The first pull-down control circuit 400 specifically includes: a fourth thin film transistor T51, a control terminal and a first terminal thereof being inputted with the first low-frequency signal LC1; a fifth thin film transistor T53, a control terminal thereof being connected with a second terminal of the fourth thin film transistor T51, a first terminal thereof being inputted with the first low-frequency signal LC1; and a sixth thin film transistor T54, a control terminal thereof being inputted with the (n+2)th-stage stage-transfer signal ST(n+2), a first terminal thereof being inputted with the first low-frequency signal LC1. Second terminals of the fourth thin film transistor T51, the fifth thin film transistor T53 and the sixth thin film transistor T54 are connected with a first pull-down control signal node P and used to output the first pull-down control signal P(n).

The first pull-down circuit 500 specifically includes: a seventh thin film transistor T42, a control terminal thereof being connected with the first pull-down control signal node P and used to receive the first pull-down control signal P(n), a second terminal thereof being inputted with a DC low voltage signal Vss, a first terminal thereof being connected with the pull-up control signal node Q, and thereby the seventh thin film transistor T42 being used to pull down the pull-up control signal Q(n) according to the first pull-down control signal P(n) and the DC low voltage signal Vss; and an eighth thin film transistor T32, a control terminal thereof being connected with the first pull-down control signal node P and used to receive the first pull-down control signal P(n), a second terminal thereof being inputted with the DC low voltage signal Vss, a first terminal thereof being connected with the horizontal scan line G, and thereby the eighth thin film transistor T32 being used to pull down the scan drive signal G(n) according to the first pull-down control signal P(n) and the DC low voltage signal Vss.

The second pull-down control circuit 600 specifically includes: a ninth thin film transistor T61, a control terminal and a first terminal thereof being inputted with the second low-frequency signal LC2; a tenth thin film transistor T63, a control terminal thereof being connected with a second terminal of the ninth thin film transistor T61, and a first terminal thereof being inputted with the second low-frequency signal LC2; and an eleventh thin film transistor T64, a control terminal thereof being inputted with the (n+2)th-stage stage-transfer signal ST(n+2), and a first terminal thereof being inputted with the second low-frequency signal LC2. Second terminals of the ninth thin film transistor T61, the tenth thin film transistor T63 and the eleventh thin film transistor T64 are connected with a second pull-down control signal node K and used to output a second pull-down control signal K(n).

The second pull-down circuit 700 specifically includes: a twelfth thin film transistor T43, a control terminal thereof being connected with the second pull-down control signal node K and used to receive the second pull-down control signal K(n), a second terminal thereof being inputted with the DC low voltage signal Vss, a first terminal thereof being connected with the pull-up control signal node Q, and thereby the twelfth thin film transistor T43 being used to pull down the pull-up control signal Q(n) according to the second pull-down control signal K(n) and the DC low voltage signal Vss; and a thirteen thin film transistor T33, a control terminal thereof being connected with the second pull-down control signal point K and used to receive the second pull-down control signal K(n), a second terminal thereof being inputted with the DC low voltage signal Vss, a first terminal thereof being connected with the horizontal scan line G, and thereby the thirteen thin film transistor T33 being used to pull down the scan drive signal G(n) according to the second pull-down control signal K(n) and the DC low voltage signal Vss.

The main pull-down circuit 800 specifically includes: a fourteenth thin film transistor T41, a control terminal thereof being inputted with the (n+2)th-stage stage-transfer signal ST(n+2), a second terminal thereof being inputted with the DC low voltage signal Vss, a first terminal thereof being connected with the pull-up control signal node Q, and thereby the fourteenth thin film transistor T41 being used to pull down the pull-up control signal Q(n) according to the (n+2)th-stage stage-transfer signal ST(n+2) and the DC low voltage signal Vss; and a fifteenth thin film transistor T31, a control terminal thereof being inputted with the (n+2)th-stage stage-transfer signal ST(n+2), a second terminal thereof being inputted with the DC low voltage signal Vss, a first terminal thereof being connected with the horizontal scan line G, and thereby the fifteenth thin film transistor T31 being used to pull down the scan drive signal G(n) according to the (n+2)th-stage stage-transfer signal ST(n+2) and the DC low voltage signal Vss.

The pull-up sustain circuit 900 specifically includes: a sixteenth thin film transistor T52, a control terminal thereof being connected with the pull-up control signal node Q and used to receive the pull-up control signal Q(n), a second terminal thereof being inputted with the DC low voltage signal Vss, and a first terminal thereof being connected with the first pull-down control signal node P, and thereby the sixteenth thin film transistor T52 being used to pull down the pull-down control signal P(n) according to the pull-up control signal Q(n) and the DC low voltage Vss; a seventeenth thin film transistor T56, a control terminal thereof being connected with the pull-up control signal node Q and used to receive the pull-up control signal Q(n), a second terminal thereof being inputted with the DC low voltage signal Vss, a first terminal thereof being connected with the first pull-down control signal node P, and thereby the seventeenth thin film transistor T56 being used to pull down the pull-down control signal P(n) according to the pull-up control signal Q(n) and the DC low voltage signal Vss; an eighteenth thin film transistor T62, a control terminal thereof being connected with the pull-up control signal point Q and used to receive the pull-up control signal Q(n), a second terminal thereof being inputted with the DC low voltage signal Vss, a first terminal thereof being connected with the second pull-up control signal node K, and thereby the eighteenth thin film transistor T62 being used to pull down the pull-down control signal K(n) according to the pull-up control signal Q(n) and the DC low voltage signal Vss; a nineteenth thin film transistor T66, a control terminal thereof being connected with the pull-up control signal node Q and used to receive the pull-up control signal Q(n), a second terminal thereof being inputted with the DC low voltage signal Vss, a first terminal thereof being connected with the second pull-down control signal node K, and thereby the nineteenth thin film transistor T66 being used to pull down the pull-down control signal K(n) according to the pull-up control signal Q(n) and the DC low voltage signal Vss; and a twentieth thin film transistor T55, a control terminal thereof being connected with the pull-up control signal node Q and used to receive the pull-up control signal Q(n), a second terminal thereof being connected with the second pull-down control signal node K, a first terminal thereof being connected with the first pull-down control signal node P, and thereby the twentieth thin film transistor T55 being used to control the first pull-down control signal P(n) and the second pull-down control signal K(n) to be maintained at the same potential.

The twentieth thin film transistor T55 is turned on when receives the pull-up control signal Q(n), so as to keep the first pull-down control signal P(n) and the second pull-down control signal K(n) at the same potential. Moreover, the twentieth thin film transistor T55 further can add a discharging path for the first pull-down control signal P(n) and the second pull-down control signal K(n), for example, when the pull-up control signal Q(n) inputted at the pull-up control signal node Q connected with the twentieth thin film transistor T55 is at a high level, the twentieth thin film transistor T55 is turned on, if the first low-frequency signal LC1 at this time is at a high level, the pull-down control circuit charges the first pull-down control signal node P so that the first pull-down control signal P(n) is at a high level, at this time the (n+2)th-stage stage-transfer signal ST(n+2) inputted to the control terminal of the eleventh thin film transistor T64 is at a high level, the second low-frequency signal LC2 is at a low level, so that the eleventh thin film transistor T64 is turned on, the second pull-down control signal K(n) outputted at the pull-down control signal node K is at a low level, and therefore it is realized that the first pull-down control signal P(n) outputted by the first pull-down control signal node P is discharged to the second pull-down control signal node K.

The embodiment of the invention uses the DC high voltage signal as the input source of the pull-up circuit of GOA unit and only uses the clock signal as the input source of the stage-transfer signal, which can improve the stage-transfer efficiency of GOA unit and the output quality of scan drive signal, and further can hold the outputs of the stage-transfer signal and the scan drive signal by adding the pull-up holding circuit and thereby improve the stability of the stage-transfer signal and the scan drive signal.

Figure 3:
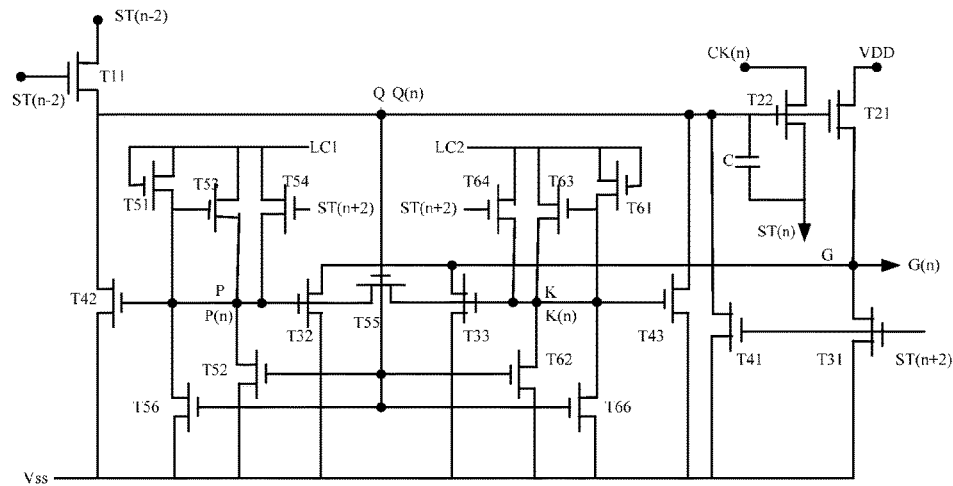
FIG. 3 is still another structural schematic view of a GOA circuit provided by an embodiment of the invention.

Referring to FIG. 3, FIG. 3 is still another structural schematic view of a GOA circuit provided by an embodiment of the invention, a main difference of the embodiment as shown in FIG. 3 from the embodiment as shown in FIG. 2 is the pull-up control circuit 100, and for the sake of simplicity, the portions same as that in the embodiment as shown in FIG. 2 will not be repeated.

In the pull-up control circuit 100 of the GOA circuit as shown in FIG. 3, the control terminal and the first terminal of the first thin film transistor T11 both are inputted with the (n−2)th-stage stage-transfer signal ST(n−2), the second terminal thereof is connected with the pull-up control signal node Q, and thereby the first thin film transistor T11 is used to output the pull-up control signal Q(n) according to the (n−2)th-stage stage-transfer signal ST(n−2).

The embodiment of the invention can improve the stage-transfer efficiency of GOA unit and the output quality of scan drive signal, and can maintain the output stability of the stage-transfer signal and the scan drive signal. Moreover, by replacing the DC high voltage signal VDD inputted to the first terminal of the first thin film transistor T11 with the (n−2)th-stage stage-transfer signal ST(n−2), which can reduce the voltage stress of the first thin film transistor T11 and increase the service life of the first thin film transistor T11.

Figure 4:
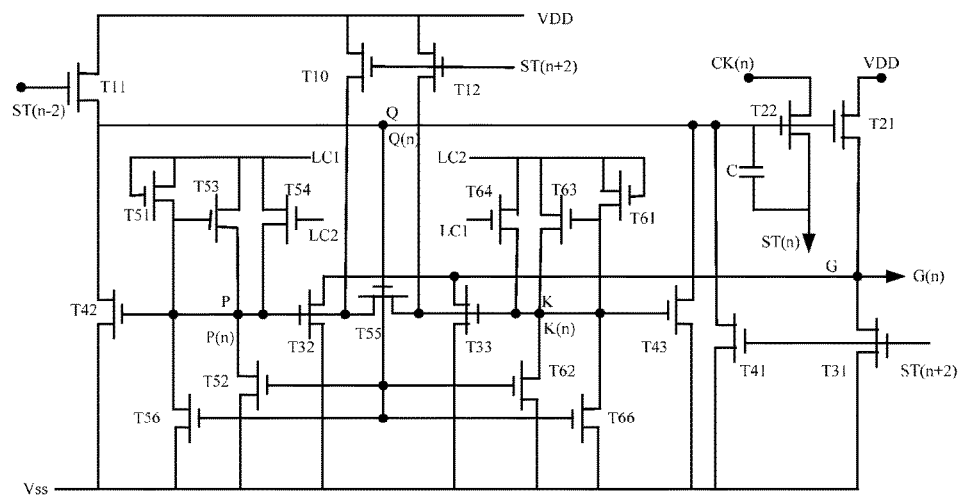
FIG. 4 is further still another structural schematic view of a GOA circuit provided by an embodiment of the invention.

Referring to FIG. 4, FIG. 4 is further still another structural schematic view of a GOA circuit provided by an embodiment of the invention, main differences of the embodiment as shown in FIG. 4 from the embodiment as shown in FIG. 2 are the first pull-down control circuit 400 and the second pull-down control circuit 600, and for the sake of simplicity, the same portions will not be repeated.

In particular, the first pull-down control circuit 400 of the GOA circuit as shown in FIG. 4 includes:

a fourth thin film transistor T51, a control terminal and a first terminal thereof being inputted with the first low-frequency signal LC1;

a fifth thin film transistor T53, a control terminal thereof being connected with a second terminal of the fourth thin film transistor T51, and a first terminal thereof being inputted with the first low-frequency signal LC1;

a sixth thin film transistor T54, a control terminal thereof being inputted with the second low-frequency signal LC2, and a first terminal thereof being inputted with the first low-frequency signal LC1;

a twenty-first thin film transistor T10, a control terminal thereof being inputted with the (n+2)th-stage stage-transfer signal ST(n+2), and a first terminal thereof being inputted with the DC high voltage signal VDD;

second ends of the fourth thin film transistor T51, the fifth thin film transistor T53, the twenty-first thin film transistor T10 and the sixth thin film transistor T54 are connected with the first pull-down control signal node P and used to output the first pull-down control signal P(n).

The second pull-down control circuit 600 as shown in FIG. 4 includes:

a ninth thin film transistor T61, a control terminal and a first terminal thereof being inputted with the second low-frequency signal LC2;

a tenth thin film transistor T63, a control terminal thereof being connected with a second terminal of the ninth thin film transistor T61, and a first terminal thereof being inputted with the second low-frequency signal LC2;

an eleventh thin film transistor T64, a control terminal thereof being inputted with the first low-frequency signal LC1, and a first terminal thereof being inputting with the second low-frequency signal LC2;

a twenty-second thin film transistor T12, a control terminal thereof being inputted with the (n+2)th-stage stage-transfer signal ST(n+2), and a first terminal thereof being inputted with the DC high voltage signal VDD;

second ends of the ninth thin film transistor T61, the tenth thin film transistor T63, the twenty-second thin film transistor T12 and the eleventh thin film transistor T64 are connected with the second pull-down control signal node K and used to output the second pull-down control signal K(n).

The embodiment of the invention can improve the stage-transfer efficiency of GOA unit and the output quality of scan drive signal, and can maintain the output stability of the stage-transfer signal and the scan drive signal. Moreover, by adding the twenty-first thin film transistor T10 and the twenty-second thin film transistor T12 respectively in the first pull-down control circuit and the second pull-down control circuit, their first terminals being inputted with the DC high voltage signal, their control terminals being inputted with the (n+2)th-stage stage-transfer signal ST(n+2), and their second terminals respectively being connected with the first pull-down control signal node P and the second pull-down control signal node K, which can improve the pull-down speeds of the first pull-down control signal P(n) and the second pull-down control signal K(n).

Figure 5:
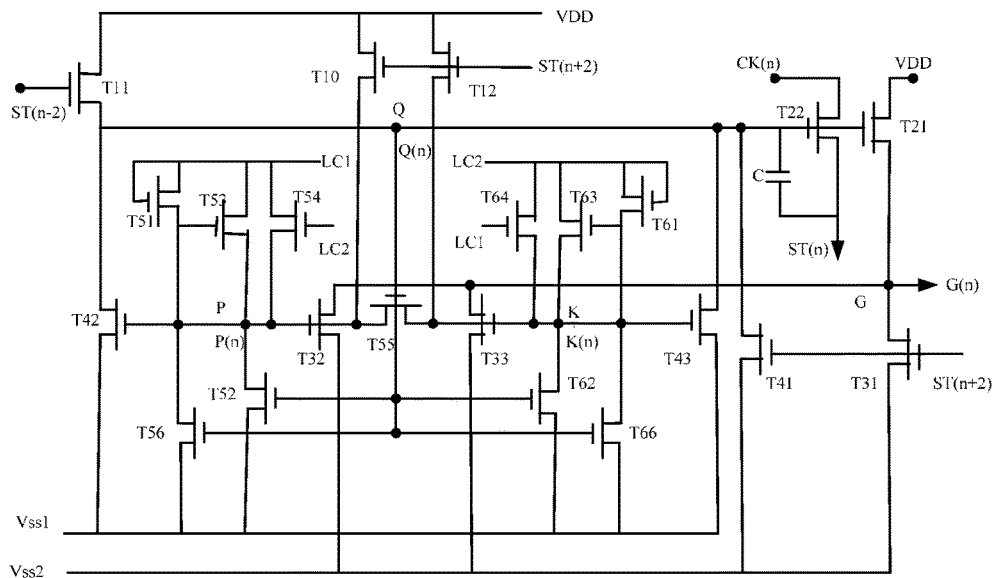
FIG. 5 is even still another structural schematic view of a GOA circuit provided by an embodiment of the invention.

Referring to FIG. 5, FIG. 5 is even still another structural schematic view of a GOA circuit provided by an embodiment of the invention, main differences of the embodiment as shown in FIG. 5 from the embodiment as shown in FIG. 4 are the first pull-down circuit 500, the second pull-down circuit 700 and the main pull-down circuit 800, and for the sake of simplicity, the same portions will not be repeated.

Specifically, the first pull-down circuit 500 of the GOA circuit as shown in FIG. 5 includes:

a seventh thin film transistor T42, a control terminal thereof being connected with the first pull-down control signal node P and used to receive the first pull-down control signal P(n), a second terminal thereof being inputted with a first DC low voltage signal Vss1, a first terminal thereof being connected with the pull-up control signal node Q, and thereby the seventh thin film transistor T42 being used to pull down the pull-up control signal Q(n) according to the first pull-down control signal P(n) and the first DC low voltage signal Vss1;

an eighth thin film transistor T32, a control terminal thereof being connected with the first pull-down control signal node P and used to receive the first pull-down control signal P(n), a second terminal thereof being inputted with a second DC low voltage signal Vss2, a first terminal thereof being connected with the horizontal scan line G, and thereby the eighth thin film transistor T32 being used to pull down the scan drive signal G(n) according to the first pull-down control signal P(n) and the second DC low voltage signal Vss2.

The second pull-down circuit 700 of the GOA circuit as shown in FIG. 5 includes:

a twelfth thin film transistor T43, a control terminal thereof being connected with the second pull-down control signal node K and used to receive the second pull-down control signal K(n), a second terminal thereof being inputted with the first DC low voltage signal Vss1, a first terminal thereof being connected with the pull-up control signal node Q, and thereby the twelfth thin film transistor T43 being used to pull down the pull-up control signal Q(n) according to the second pull-down control signal K(n) and the first DC low voltage signal Vss1;

a thirteen thin film transistor T33, a control terminal thereof being connected with the second pull-down control signal node K and used to receive the second pull-down control signal K(n), a second terminal thereof being inputted with the second DC low voltage signal Vss2, a first terminal thereof being connected with the horizontal scan line G, and thereby the thirteen thin film transistor T33 being used to pull down the scan drive signal G(n) according to the second pull-down control signal K(n) and the second DC low voltage signal Vss2.

The main pull-down circuit 800 of the GOA circuit as shown in FIG. 5 includes:

a fourteenth thin film transistor T41, a control terminal thereof being inputted with the (n+2)th-stage stage-transfer signal ST(n+2), a second terminal thereof being inputted with the second DC low voltage signal Vss2, a first terminal thereof being connected with the pull-up control signal node Q, and thereby the fourteenth thin film transistor T41 being used to pull down the pull-up control signal Q(n) according to the (N+2)th-stage stage-transfer signal ST(n+2) and the second DC low voltage signal Vss2;

a fifteenth thin film transistor T31, a control terminal thereof being inputted with the (n+2)th-stage stage-transfer signal ST(n+2), a second terminal thereof being inputted with the second DC low voltage signal Vss2, a first terminal thereof being connected with the horizontal scan line G, and thereby the fifteenth thin film transistor T31 being used to pull down the scan drive signal G(n) according to the (n+2)th-stage stage-transfer signal ST(n+2) and the second DC low voltage signal Vss2.

The embodiment of the invention can improve the stage-transfer efficiency of GOA unit and the output quality of scan drive signal, and can maintain the output stability of the stage-transfer signal and the scan drive signal. Moreover, by using two low voltage direct current (DC) signals as the pull-down sources of the first pull-down control signal P(n) and the second pull-down control signal K(n), and Vss1 being greater than Vss2, so that the voltage between the control terminal and the second terminal of the second thin film transistor T21 is less than zero, the leakage of electricity can be reduced.

Figure 6:
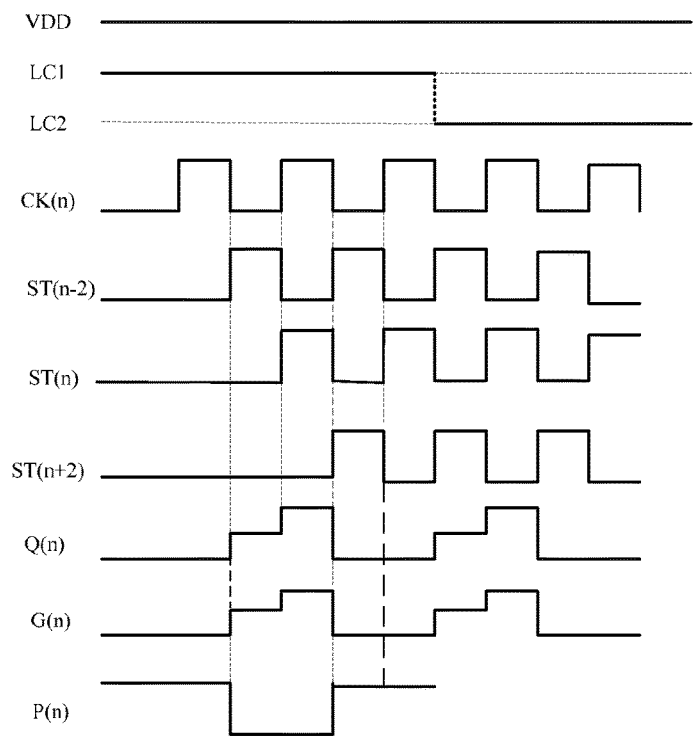
FIG. 6 is a waveform diagram of various key nodes of a GOA circuit provided by an embodiment of the invention.

Referring to FIG. 6, FIG. 6 is a waveform diagram of various key nodes of a GOA circuit provided by an embodiment of the invention, in FIG. 6, waveforms of the DC high voltage signal VDD, the clock signal CK(n), the nth-stage stage-transfer signal ST(n), the (n+2)th-stage stage-transfer signal ST(n+2), the scan drive signal G(n), the first pull-down control signal P(n), the first low-frequency signal LC1, the second low-frequency signal LC2 and the (n−2)th-stage stage-transfer signal ST(n−2) are shown. The phases of the first low-frequency signal LC1 and the second low-frequency signal LC2 are reverse.

As seen from the waveform diagram, when the potential of ST(n−2) is at a high level, VDD charges the node Q, Q(n) becomes a high level, P(n) becomes a low level, and at this time, the clock signal CK(n) is at a low level, ST(n) is at a low level, and G(n) is at a high level. When the potential of ST(n−2) is at a low level, the node Q(n) becomes a high level, CK(n) is at a high level, ST(n) is at a high level, owing to the coupling of C, Q(n) is raised to a higher level, G(n) is at a high level. When the potential of ST(n+2) is at a high level, CK(n) is at a low level, Q(n) and G(n) become low levels.

Correspondingly, an embodiment of the invention also provides a liquid crystal display (LCD) device which includes the GOA circuit for liquid crystal displaying as illustrated in any one of the embodiments of FIG. 2 through FIG. 5.

The embodiment of the invention uses a DC high voltage signal as the input source of the pull-up circuit of GOA unit and only uses a clock signal as the input source of stage-transfer signal, which can avoid the impact on the stage-transfer efficiency caused by the delay of clock signal to thereby improve the stage-transfer efficiency of GOA unit, and also can improve the output quality of scan drive signal to thereby increase the charging ratio of LCD tubes.

While the GOA circuit and the liquid crystal display device of the invention have been described in terms of what are presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A GOA circuit comprising a plurality of cascade connected GOA units, wherein an nth-stage GOA unit of the plurality of cascade connected GOA units is configured for charging an nth horizontal scan line in a display area, the nth-stage GOA unit comprises a pull-up control circuit, a pull-up circuit, a transfer circuit, a first pull-down control circuit, a first pull-down circuit, a second pull-down control circuit, a second pull-down circuit and a main pull-down circuit, where n is a positive integer;

the pull-up control circuit is configured for receiving an (n−2)th-stage stage-transfer signal outputted by an (n−2)th-stage GOA unit, and outputting a pull-up control signal according to the (n−2)th-stage stage-transfer signal;

the pull-up circuit is configured for receiving a DC high voltage signal and the pull-up control signal, and outputting a scan drive signal according to the DC high voltage signal and the pull-up control signal;

the transfer circuit is configured for receiving a clock signal and the pull-up control signal, and outputting an nth-stage stage-transfer signal according to the clock signal and the pull-up control signal;

the first pull-down control circuit is configured for receiving a first low-frequency signal and an (n+2)th-stage stage-transfer signal generated from an (n+2)th-stage GOA unit, and outputting a first pull-down control signal according to the first low-frequency signal and the (n+2)th-stage stage-transfer signal;

the first pull-down circuit is configured for receiving the first pull-down control signal and a DC low voltage signal, and pulling down the pull-up control signal according to the first pull-down control signal and the DC low voltage signal to thereby pull down the scan drive signal and the nth-stage stage-transfer signal;

the second pull-down control circuit is configured for receiving a second low-frequency signal and the (n+2)th-stage stage-transfer signal, and outputting a second pull-down control signal according to the second low-frequency signal and the (n+2)th-stage stage-transfer signal;

the second pull-down circuit is configured for receiving the second pull-down control signal and the DC low voltage signal, and pulling down the pull-up control signal according to the second pull-down control signal and the DC low voltage signal to thereby pull down the scan drive signal and the nth-stage stage-transfer signal;

the main pull-down circuit is configured for receiving the DC low voltage signal and the (n+2)th-stage stage-transfer signal, and pulling down the pull-up control signal and the scan drive signal according to the DC low voltage signal and the (n+2)th-stage stage-transfer signal.

2. The circuit as claimed in claim 1, wherein
the first pull-down control circuit further is configured for receiving the DC high voltage signal and the second low-frequency signal, and outputting the first pull-down control signal according to the first low-frequency signal, the DC high voltage signal, the second low-frequency signal and the (n+2)th-stage stage-transfer signal.

3. The circuit as claimed in claim 1, wherein
the second pull-down control circuit further is configured for receiving the DC high voltage signal and the first low-frequency signal, and outputting the second pull-down control signal according to the first low-frequency signal, the DC high voltage signal, the second low-frequency signal and the (n+2)th-stage stage-transfer signal.

4. The circuit as claimed in claim 1, wherein phases of the first low-frequency signal and the second low-frequency signal are reverse.

5. The circuit as claimed in claim 1, wherein the GOA circuit further comprises:
a pull-up holding circuit, configured for receiving the pull-up control signal and the DC low voltage signal, and pulling down the first pull-down control signal and the second pull-down control signal according to the pull-up control signal and the DC low voltage signal to thereby hold the pull-up circuit and the transfer circuit respectively to output the scan drive signal and the nth-stage stage-transfer signal.

6. The circuit as claimed in claim 1, wherein the pull-up control circuit is configured for receiving the DC high voltage signal, and outputting the pull-up control signal according to the (n−2)th-stage stage-transfer signal and the DC high voltage signal.

7. The circuit as claimed in claim 1, wherein the pull-up control circuit comprises:
a first thin film transistor, a control terminal thereof being configured for inputting with the (n−2)th-stage stage-transfer signal, a first terminal thereof being configured for inputting with the DC high voltage signal, a second terminal thereof being connected with a pull-up control signal node, and thereby the first thin film transistor being used for outputting the pull-up control signal according to the (n−2)th-stage stage-transfer signal and the DC high voltage signal.

8. The circuit as claimed in claim 7, wherein the pull-up control circuit comprises:
a second thin film transistor, a control terminal thereof being connected with the pull-up control signal node and used for receiving the pull-up control signal, a first terminal thereof being configured for inputting with the DC high voltage signal, a second terminal thereof being connected with a horizontal scan line, and thereby the second thin film transistor being used for outputting the scan drive signal according to the pull-up control signal and the DC high voltage signal.

9. The circuit as claimed in claim 8, wherein the transfer circuit further comprises:
a bootstrap capacitor, the bootstrap capacitor being coupled with the control terminal and the second terminal of the third thin film transistor and used for boosting up the pull-up control signal.

10. The circuit as claimed in claim 8, wherein the transfer circuit comprises:
a third thin film transistor, a control terminal thereof being connected with the pull-up control signal node and used for receiving the pull-up control signal, a first terminal thereof being configured for inputting with the clock signal, and a second terminal thereof being configured for outputting the stage-transfer signal according to the pull-up control signal and the clock signal.

11. The circuit as claimed in claim 10, wherein the first pull-down control circuit comprises:
a fourth thin film transistor, a control terminal and a first terminal being configured for inputting with the first low-frequency signal;
a fifth thin film transistor, a control terminal thereof being connected with a second terminal of the fourth thin film transistor, and a first terminal thereof being configured for inputting with the first low-frequency signal;
a sixth thin film transistor, a control terminal thereof being configured for inputting with the second low-frequency signal, and a first terminal thereof being configured for inputting with the first low-frequency signal;
a twenty-first thin film transistor, a control terminal thereof being configured for inputting with the (n+2)th-stage stage-transfer signal, and a first terminal thereof being configured for inputting with the DC high voltage signal;
second terminals of the fourth thin film transistor, the fifth thin film transistor, the twenty-first thin film transistor and the sixth thin film transistor being connected with the first pull-down control signal node and used for outputting the first pull-down control signal.

12. The circuit as claimed in claim 10, wherein the first pull-down control circuit comprises:
- a fourth thin film transistor, a control terminal and a first terminal thereof being configured for inputting with the first low-frequency signal;
- a fifth thin film transistor, a control terminal thereof being connected with a second terminal of the fourth thin film transistor, and a first terminal thereof being configured for inputting with the first low-frequency signal;
- a sixth thin film transistor, a control terminal thereof being configured for inputting with the (n+2)th-stage stage-transfer signal, and a first terminal thereof being configured for inputting with the first low-frequency signal;
- second terminals of the fourth thin film transistor, the fifth thin film transistor and the sixth thin film transistor being connected with a first pull-down control signal node and used for outputting the first pull-down control signal.

13. The circuit as claimed in claim 12, wherein the first pull-down circuit comprises:
- a seventh thin film transistor, a control terminal thereof being connected with the first pull-down control signal node and used for receiving the first pull-down control signal, a second terminal thereof being configured for inputting with a DC low voltage signal, a first terminal thereof being connected with the pull-up control signal node, and thereby the seventh thin film transistor being used for pulling down the pull-up control signal according to the first pull-down control signal and the DC low voltage signal;
- an eighth thin film transistor, a control terminal thereof being connected with the first pull-down control signal node and used for receiving the first pull-down control signal, a second terminal thereof being configured for inputting with the DC low voltage signal, a first terminal thereof being connected with the horizontal scan line, and thereby the eighth thin film transistor being used for pulling down the scan drive signal according to the first pull-down control signal and the DC low voltage signal.

14. The circuit as claimed in claim 13, wherein the second pull-down control circuit comprises:
- a ninth thin film transistor, a control terminal and a first terminal thereof being configured for inputting with the second low-frequency signal;
- a tenth thin film transistor, a control terminal thereof being connected with a second terminal of the ninth thin film transistor, and a first terminal being configured for inputting with the second low-frequency signal;
- an eleventh thin film transistor, a control terminal thereof being configured for inputting with the first low-frequency signal, and a first terminal thereof being configured for inputting with the second low-frequency signal;
- a twenty-second thin film transistor, a control terminal thereof being configured for inputting with the (n+2)th-stage stage-transfer signal, and a first terminal thereof being configured for inputting with the DC high voltage signal;
- second terminals of the ninth thin film transistor, the tenth thin film transistor, the twenty-second thin film transistor and the eleventh thin film transistor being connected with the second pull-down control signal node and used for outputting the second pull-down control signal.

15. The circuit as claimed in claim 13, wherein the second pull-down circuit comprises:
- a ninth thin film transistor, a control terminal and a first terminal thereof being configured for inputting with the second low-frequency signal;
- a tenth thin film transistor, a control terminal thereof being connected with a second terminal of the ninth thin film transistor, and a first terminal being configured for inputting with the second low-frequency signal;
- an eleventh thin film transistor, a control terminal thereof being configured for inputting with the (n+2)th-stage stage-transfer signal, and a first terminal thereof being configured for inputting with the second low-frequency signal;
- second terminals of the ninth thin film transistor, the tenth thin film transistor and the eleventh thin film transistor being connected with a second pull-down control signal node and used for outputting a second pull-down control signal.

16. The circuit as claimed in claim 15, wherein the second pull-down circuit comprises:
- a twelfth thin film transistor, a control terminal thereof being connected with the second pull-down control signal node and used for receiving the second pull-down control signal, a second terminal thereof inputting with the DC low voltage signal, a first terminal thereof being connected with the pull-up control signal node, and thereby the twelfth thin film transistor being used for pulling down the pull-up control signal according to the second pull-down control signal and the DC low voltage signal;
- a thirteen thin film transistor, a control terminal thereof being connected with the second pull-down control signal node and used for receiving the second pull-down control signal, a second terminal thereof being configured for inputting with the DC low voltage signal, a first terminal thereof being connected with the horizontal scan line, and thereby the thirteen thin film transistor being used for pulling down the scan drive signal according to the second pull-down control signal and the DC low voltage signal.

17. The circuit as claimed in claim 16, wherein the main pull-down circuit comprises:
- a fourteenth thin film transistor, a control terminal thereof being configured for inputting with the (n+2)th-stage stage-transfer signal, a second terminal thereof being configured for inputting with the DC low voltage signal, a first terminal thereof being connected with the pull-up control signal node, and thereby the fourteenth thin film transistor being used for pulling down the pull-up control signal according to the (n+2)th-stage stage-transfer signal and the DC low voltage signal;
- a fifteenth thin film transistor, a control terminal thereof being configured for inputting with the (n+2)th-stage stage-transfer signal, a second terminal thereof being configured for inputting with the DC low voltage signal, a first terminal thereof being connected with the horizontal scan line, and thereby the fifteenth thin film transistor being used for pulling down the scan drive signal according to the (n+2)th-stage stage-transfer signal and the DC low voltage signal.

18. The circuit as claimed in claim 17, wherein the pull-up holding circuit comprises:
- a sixteenth thin film transistor, a control terminal thereof being connected with the pull-up control signal node and used for receiving the pull-up control signal, a second terminal thereof being configured for inputting with the DC low voltage signal, a first terminal thereof being connected with the first pull-down control signal node, and thereby the sixteenth thin film transistor being used for pulling down the pull-down control signal according to the pull-up control signal and the DC low voltage;

a seventeenth thin film transistor, a control terminal thereof being connected with the pull-up control signal node and used for receiving the pull-up control signal, a second terminal thereof being configured for inputting with the DC low voltage signal, a first terminal thereof being connected with the first pull-down control signal node, and thereby the seventeenth thin film transistor being used for pulling down the pull-down control signal according to the pull-up control signal and the DC low voltage signal;

an eighteenth thin film transistor, a control terminal thereof being connected with the pull-up control signal node and used for receiving the pull-up control signal, a second terminal thereof being configured for inputting with the DC low voltage signal, a first terminal thereof being connected with the second pull-down control signal node, and thereby the eighteenth thin film transistor being used for pulling down the pull-down control signal according to the pull-up control signal and the DC low voltage signal;

a nineteenth thin film transistor, a control terminal thereof being connected with the pull-up control signal node and used for receiving the pull-up control signal, a second terminal thereof being configured for inputting with the DC low voltage signal, a first terminal thereof being connected with the second pull-down control signal node, and thereby the nineteenth thin film transistor being used for pulling down the pull-down control signal according to the pull-up control signal and the DC low voltage signal;

a twentieth thin film transistor, a control terminal thereof being connected with the pull-up control signal node and used for receiving the pull-up control signal, a second terminal thereof being connected with the second pull-down control signal node, a first terminal thereof being connected with the first pull-down control signal node, and thereby the twentieth thin film transistor being used for controlling the first pull-down control signal and the second pull-down control signal to be maintained at a same potential according to the pull-up control signal.

19. The circuit as claimed in claim 1, wherein the pull-up control circuit comprises:

a first thin film transistor, a control terminal and a first terminal thereof being configured for inputting with the (n−2)th-stage stage-transfer signal, a second terminal thereof being connected with the pull-up control signal node, and thereby the first thin film transistor being used for outputting the pull-up control signal according to the (n−2)th-stage stage-transfer signal.

20. A liquid crystal display device comprising a plurality of cascade connected GOA units, wherein an nth-stage GOA unit of the plurality of cascade connected GOA units is configured for charging an nth-stage horizontal scan line in a display area, the nth-stage GOA unit comprises a pull-up control circuit, a pull-up circuit, a transfer circuit, a first pull-down control circuit, a first pull-down circuit, a second pull-down control circuit, a second pull-down circuit and a main pull-down circuit, where n is a positive integer;

the pull-up control circuit is configured for receiving an (n−2)th-stage stage-transfer signal outputted by an (n−2)th-stage GOA unit, and outputting a pull-up control signal according to the (n−2)th-stage stage-transfer signal;

the pull-up circuit is configured for receiving a DC high voltage signal and the pull-up control signal, and outputting a scan drive signal according to the DC high voltage signal and the pull-up control signal;

the transfer circuit is configured for receiving a clock signal and the pull-up control signal, and outputting an nth-stage stage-transfer signal according to the clock signal and the pull-up control signal;

the first pull-down control circuit is configured for receiving a first low-frequency signal and an (n+2)th-stage stage-transfer signal generated from an (n+2)th-stage GOA unit, and outputting a first pull-down control signal according to the first low-frequency signal and the (n+2)th-stage stage-transfer signal;

the first pull-down circuit is configured for receiving the first pull-down control signal and a DC low voltage signal, and pulling down the pull-up control signal according to the first pull-down control signal and the DC low voltage signal to thereby pull down the scan drive signal and the nth-stage stage-transfer signal;

the second pull-down control circuit is configured for receiving a second low-frequency signal and the (n+2)th-stage stage-transfer signal, and outputting a second pull-down control signal according to the second low-frequency signal and the (n+2)th-stage stage-transfer signal;

the second pull-down circuit is configured for receiving the second pull-down control signal and the DC low voltage signal, and pulling down the pull-up control signal according to the second pull-down control signal and the DC low voltage signal to thereby pull down the scan drive signal and the nth-stage stage-transfer signal;

the main pull-down circuit is configured for receiving the DC low voltage signal and the (n+2)th-stage stage-transfer signal, and pulling down the pull-up control signal and the scan drive signal according to the DC low voltage signal and the (n+2)th-stage stage-transfer signal.

* * * * *